(12) United States Patent
Yamauchi et al.

(10) Patent No.: US 10,998,199 B2
(45) Date of Patent: May 4, 2021

(54) ETCHING METHOD AND ETCHING APPARATUS

(71) Applicant: TOKYO ELECTRON LIMITED, Tokyo (JP)

(72) Inventors: Susumu Yamauchi, Nirasaki (JP); Jun Lin, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/368,055

(22) Filed: Mar. 28, 2019

(65) Prior Publication Data

US 2019/0304801 A1    Oct. 3, 2019

(30) Foreign Application Priority Data

Mar. 30, 2018  (JP) .............................. JP2018-069014
May 25, 2018   (JP) .............................. JP2018-100871

(51) Int. Cl.
  *H01L 21/3213*  (2006.01)
  *H01L 21/768*   (2006.01)
  *H01L 21/67*    (2006.01)
  *H01L 23/532*   (2006.01)

(52) U.S. Cl.
  CPC .. *H01L 21/32135* (2013.01); *H01L 21/67069* (2013.01); *H01L 21/76892* (2013.01); *H01L 23/53209* (2013.01)

(58) Field of Classification Search
  CPC ......... H01L 21/32135; H01L 21/67069; H01L 21/76892; H01L 23/53209
  USPC ........................................ 438/720, 722, 742
  See application file for complete search history.

(56) References Cited

U.S. PATENT DOCUMENTS

2017/0133233 A1*  5/2017  Sato ................... H01L 21/3065
2019/0348307 A1* 11/2019  Yamauchi ......... H01L 21/32135

FOREIGN PATENT DOCUMENTS

| JP | 2519625 B2 | 5/1996 | |
|----|---|---|---|
| JP | 2015-12243 A | 1/2015 | |
| JP | 2015-19065 A | 1/2015 | |
| KR | 10-2015-0007993 A | 1/2015 | |
| WO | WO-2016013418 A1 * | 1/2016 | ......... H01L 21/3065 |

\* cited by examiner

*Primary Examiner* — Binh X Tran
(74) *Attorney, Agent, or Firm* — Nath, Goldberg & Meyer; Jerald L. Meyer

(57) ABSTRACT

There is provided an etching method including: a first gas supply step of supplying a reducing gas to a workpiece having a metal film formed thereon to reduce a front surface of the metal film, the workpiece being accommodated in at least one processing chamber; and subsequently, a second gas supply step of supplying an oxidizing gas for oxidizing the metal film and an etching gas composed of a β-diketone to etch the oxidized metal film.

9 Claims, 9 Drawing Sheets

ETCHING METHOD AND ETCHING APPARATUS

CROSS-REFERENCE TO RELATED APPLICATIONS

This application claims the benefit of Japanese Patent Application Nos. 2018-069014 and 2018-100871, filed on Mar. 30, 2018 and May 25, 2018, respectively, the disclosure of which is incorporated by reference in their entirety.

TECHNICAL FIELD

The present disclosure relates to an etching method and an etching apparatus.

BACKGROUND

There is a demand for finely forming wirings in semiconductor devices. Using Co as a metal for such wirings was under consideration. For example, techniques which dry-etch metal on the surface of a substrate such as a semiconductor wafer (hereinafter, referred to as a "wafer") are known.

As an example, there is a technique that etches a Co film on the surface of the substrate while concurrently supplying an oxygen gas and a hexafluoroacetylacetone (Hfac) gas as a β-diketone in a state in which the substrate is heated to a temperature ranging from 200 degrees C. to 400 degrees C. At this time, a flow rate ratio of the oxygen ($O_2$) gas to the Hfac gas is 1% or less. In addition, there is a technique that etches a Co film on the surface of the substrate using the Hfac gas. At this time, an oxygen gas may be added to the Hfac gas. Further, there is a technique that causes metallic contaminants such as copper on the surface of the substrate to react with a β-diketone under an oxidation atmosphere to remove the metallic contaminants.

SUMMARY

Some embodiments of the present disclosure provide a technique advantageous in increasing an etching amount of a metal film per unit time.

According to one embodiment of the present disclosure, there is provided an etching method including: a first gas supply step of supplying a reducing gas to a workpiece having a metal film formed thereon to reduce a front surface of the metal film, the workpiece being accommodated in at least one processing chamber; and subsequently, a second gas supply step of supplying an oxidizing gas for oxidizing the metal film and an etching gas composed of a β-diketone to etch the oxidized metal film.

According to another embodiment of the present disclosure, there is provided an etching apparatus including: a mounting part provided inside a processing container and configured to mount thereon a workpiece having a metal film formed thereon; a reducing gas supply part configured to supply a reducing gas for reducing a front surface of the metal film to the workpiece; an oxidizing gas supply part configured to supply an oxidizing gas for oxidizing the metal film to the workpiece; an etching gas supply part configured to supply an etching gas composed of a β-diketone for etching the metal film oxidized by the oxidizing gas to the workpiece; and a controller configured to output first control signals to the reducing gas supply part, the oxidizing gas supply part and the etching gas supply part so as to execute a first step of supplying the reducing gas to the workpiece, and subsequently, a second step of supplying the oxidizing gas and the etching gas to the workpiece.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An etching apparatus 1 for etching a Co film formed on a surface of a wafer W as a workpiece will be described with reference to a longitudinal cross-sectional view of FIG. 1. The etching apparatus 1 includes a processing container 11 whose interior is kept in a vacuum atmosphere. A stage 12 serving as a mounting table for mounting the wafer W thereon is provided inside the processing container 11. The wafer W mounted on the stage 12 is heated by a heater 13 embedded in the stage 12 to a set temperature.

Figure 1:
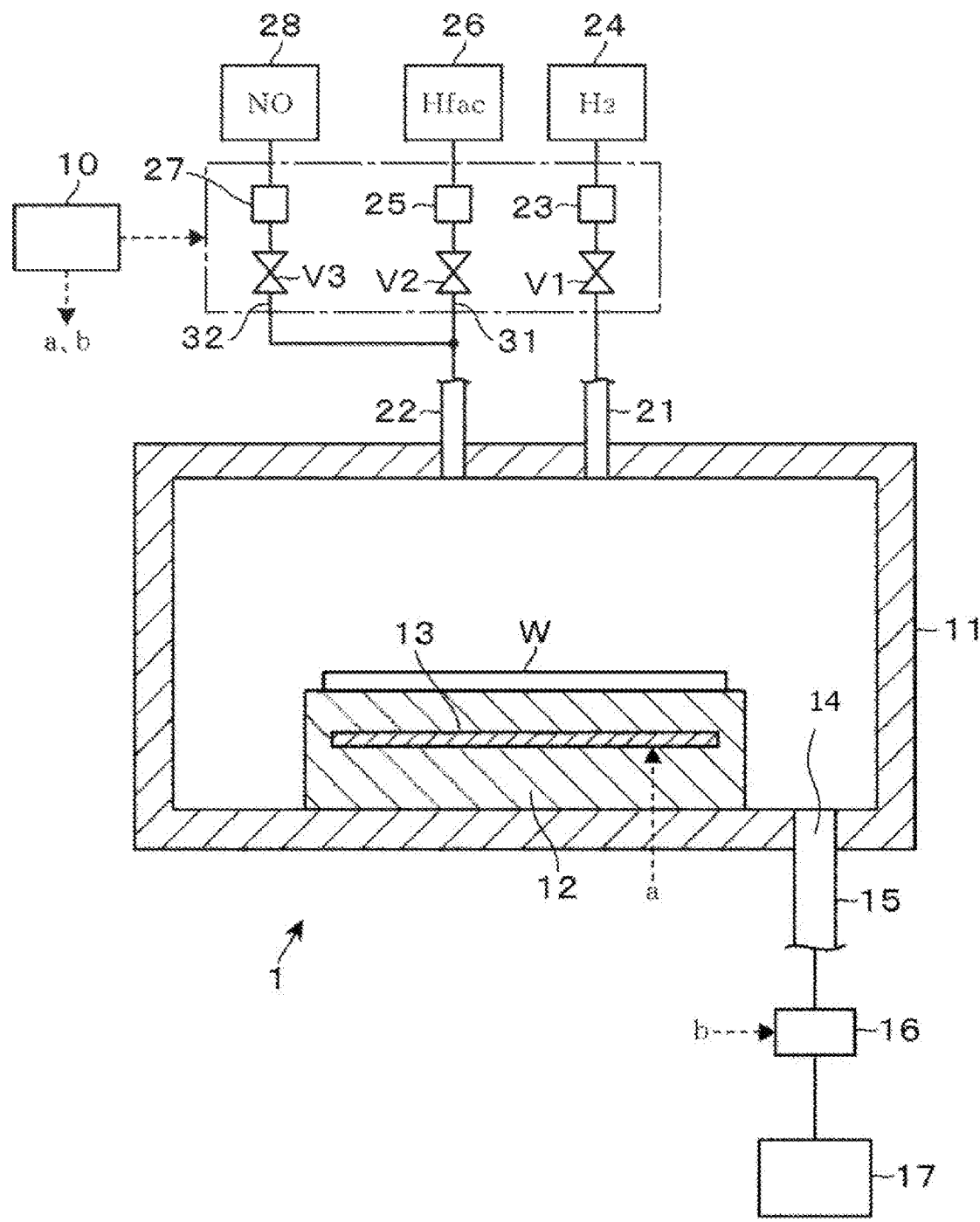
FIG. 1 is a longitudinal cross-sectional view illustrating an etching apparatus according to an embodiment of the present disclosure.

In FIG. 1, reference numeral 14 denotes an exhaust port which is opened in the bottom of the processing container 1. One end of an exhaust pipe 15 is connected to the exhaust port 14. The other end of the exhaust pipe 15 is coupled to a vacuum pump 17, which is a vacuum exhaust mechanism, via a pressure adjustment mechanism 16. An internal pressure of the processing container 11 is adjusted by adjusting an amount of gas exhausted from the exhaust port 14 using the pressure adjustment mechanism 16.

A downstream end of a pipe 21 and a downstream end of a pipe 22 are opened in a ceiling portion of the processing container 11. An upstream end of the pipe 21 is coupled to a supply source 24 of a hydrogen (H₂) gas as a reducing gas via a valve V1 and a flow rate adjustment part 23 connected in this order. An upstream side of the pipe 22 is branched into two branch pipes 31 and 32. The branch pipe 31 is coupled to a supply source 26 of a hexafluoroacetylacetone (Hfac) (also referred to as "1,1,1,5,5,5-hexafluoro-2,4-pentanedione") gas, which is a β-diketone, via a valve V2 and a flow rate adjustment part 25 connected in this order. An upstream end of the branch pipe 32 is coupled to a supply source 28 of a nitrogen monoxide (NO) gas as an oxidizing gas via a valve V3 and a flow rate adjustment part 27 connected in this order. The supply sources 24, 26, and 28 constitute a reducing gas supply part, an etching gas supply part, and an oxidizing gas supply part, respectively. The present disclosure is not limited to the example in which, as in the example illustrated in FIG. 1, the gases are supplied from the pipes into an internal processing space of the processing container 11. In some embodiments, the gases may be supplied into the internal processing space of the processing container 11 using, for example, a shower head in the form of a shower.

By opening and closing the valves V1, V2, and V3, the supply and cutoff of the H₂ gas, the Hfac gas, and the NO gas into the processing container 11 are switched. In addition, flow rates of the H₂ gas, the Hfac gas, and the NO gas supplied into the processing container 11 are adjusted by the flow rate adjustment parts 23, 25, and 27, respectively. In addition, since the NO gas and the Hfac gas are supplied to the pipe 22 common to the NO gas and the Hfac gas, they can be supplied into the processing container 11 while being mixed with each other.

The etching apparatus 1 includes a control part 10. The control part 10 is constituted with, for example, a computer, and includes a program, a memory, and a CPU. The program incorporates a group of steps so as to execute a series of operations to be described later. Based on the program, the control part 10 outputs control signals to respective parts of the etching apparatus 1 so as to control operations of the respective parts. Specifically, operations such as adjustment of the temperature of the wafer W, opening/closing of each valve V, adjustment of the flow rate of each gas, and adjustment of the internal pressure of the processing container 11 are controlled. The program is stored in a computer-readable storage medium such as a compact disk, a hard disk, a magneto-optical disk, a memory card, a DVD or the like, and is installed on the control unit 10.

Figure 2:
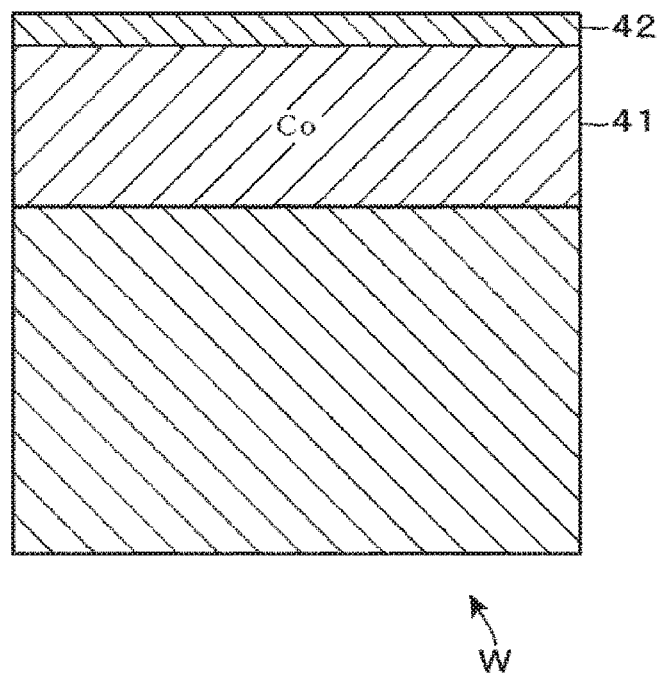
FIG. 2 is a longitudinal cross-sectional view of a wafer processed by the etching apparatus.

An outline of processes performed in the etching apparatus 1 will be described. FIG. 2 is a longitudinal cross-sectional view of the wafer W transferred to the etching apparatus 1. As described above, a Co film 41, which is a metal film used for wirings of a semiconductor device, is formed on a front surface of the wafer W as a substrate. A front surface of the Co film 41 undergoes a natural oxidation such that a relatively large amount of Co, and CoO and Co(OH)₂, which are oxides of Co is contained in the front surface. The front surface of the Co film 41 will be referred to as a natural oxide film 42. As a period of time elapses from the formation of the Co film 41, a ratio of CoO and Co(OH)₂ to Co in the natural oxide film 42 increases.

Meanwhile, in the etching apparatus 1, the Hfac gas and the NO gas are supplied to the Co film 41 to etch the Co film 41. It is considered that the etching of Co is performed through the following three steps. In a first step, NO reacts with the outermost electrons of Co such that Co is oxidized. Specifically, the reaction of the following Equation 1 produces CoO. In a second step, adsorption of NO onto CoO and subsequently formation of a complex (Co(hfac)₂) by coordination of Hfac to Co occur. Subsequently, in a third step, the Co(hfac)₂ having a relatively high vapor pressure sublimates such that Co is etched. The following Equation 2 represents the reactions of the second step and the third step. In addition, CoO—NO in Equation 2 represents NO adsorbed onto CoO. An etching rate of Co may be determined by the balance between the formation of CoO in the first step and the formation of the complex in the second step.

Equation 1

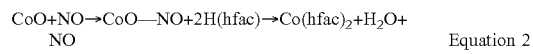

Equation 2

The present inventors have found that the etching amount (etching rate) of the Co film 41 per unit time can be increased by performing a reduction (modification) process on the natural oxide film 42, by supplying the Hfac gas and the NO gas to etch the Co film 41. This is due to the fact that CoO and Co(OH)₂ undergo the reduction process to become Co, and subsequently, CoO is produced again as described with reference to Equation 1 by the oxidation action of NO. Referencing a published report, in carrying out the oxidation process after the formation of the Co film, when an oxidation time is relatively short, CoO exists more than Co₃O₄ (more specifically, a mixture of CoO and C₂O₃), whereas when the oxidation time is relatively long, Co₃O₄ exists more than CoO. As will be described in detail later, it is considered that NO is more easily adsorbed onto CoO than Co₃O₄. That is to say, since the NO-based oxidation process is performed after the reduction process, a large amount of CoO, which has not been changed to Co₃O₄, namely a large amount of fresh CoO, is produced. The aforementioned NO is adsorbed to the CoO. Thus, the reaction of Equation 2 described above, which affects the etching rate of Co, easily occurs. As a result, it is considered that the etching rate is increased.

(First Process)

Figure 3:
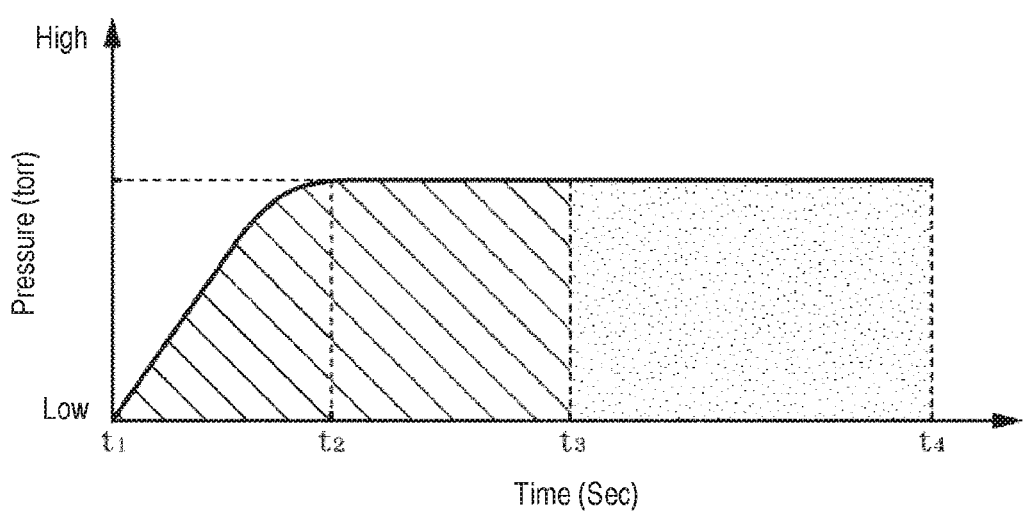
FIG. 3 is a graph showing an example of a transition of an internal pressure of a processing container which constitutes the etching apparatus.

Next, a first process performed using the etching apparatus 1 will be described with reference to FIG. 3 which shows an internal state of the processing container 11. The horizontal axis in a graph of FIG. 3 represents an elapsed time from the start of processing in the etching apparatus 1, and the vertical axis represents the internal pressure of the processing container 11. In the graph, a region is defined by a line showing the transition of the internal pressure and the horizontal axis. In this region, a time zone in which the H₂ gas is supplied is shown as a hatched region, and a time zone in which the NO gas and the Hfac gas are supplied is shown using dots.

First, the wafer W described with reference to FIG. 2 is mounted on the stage 12 and is heated by the heater 13 such that the temperature of the wafer W is increased. Meanwhile, the interior of the processing container 11 is exhausted to become a vacuum atmosphere of a predetermined pressure. Then, the valve V1 is opened and the H₂ gas is supplied into the processing container 11 at, for example, 200 to 300 sccm (time t₁ in the graph). The internal pressure of the processing container 11 is increased.

Figure 4:
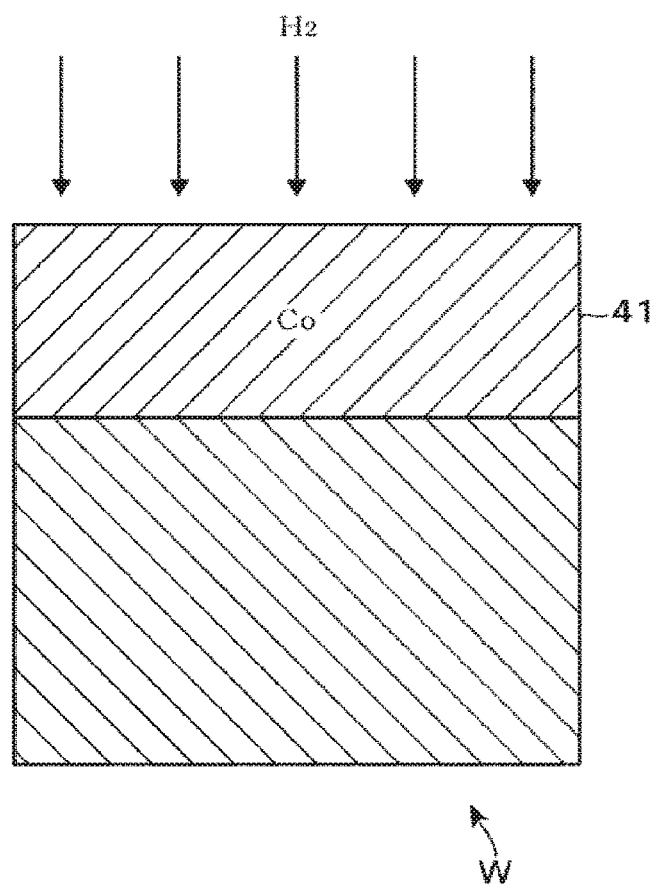
FIG. 4 is a longitudinal cross-sectional view of the wafer.

When the temperature of the wafer W reaches a set temperature of, for example, 200 to 250 degrees C., the temperature of the wafer W is maintained at the set temperature. Meanwhile, when the internal pressure of the processing container 11 reaches a set pressure of, for example, 1.33×10³ Pa (10 Torr) to 1.33×10⁴ Pa (100 Torr) (time t₂), the internal pressure of the processing container 11 is maintained at the set pressure. Under such an environment, the wafer W is exposed to the $H_2$ gas such that CoO and $Co(OH)_2$ in the natural oxide film 42 are reduced to become Co. Therefore, the natural oxide film 42 illustrated in FIG. 2 is changed to the Co film 41 as illustrated in FIG. 4.

After a predetermined period of time from the time $t_2$, the valve V1 is closed and the valves V2 and V3 are opened, and the Hfac gas and the NO gas are supplied to the wafer W inside the processing container 11 (time $t_3$). From time $t_3$, the temperature of the wafer W is continuously maintained at, for example, 200 to 250 degrees C., and the internal pressure of the processing container 11 is continuously maintained at, for example, $1.20 \times 10^4$ Pa. The flow rates of the NO gas and the Hfac gas supplied into the processing container 11 are controlled so that a ratio of the flow rate of NO gas to the flow rate of the Hfac gas becomes, for example, 0.001 to 0.7. An example of the flow rate of the NO gas may be 0.5 to 35 sccm, and an example of the flow rate of the Hfac gas may be 50 to 500 sccm.

Figure 5:
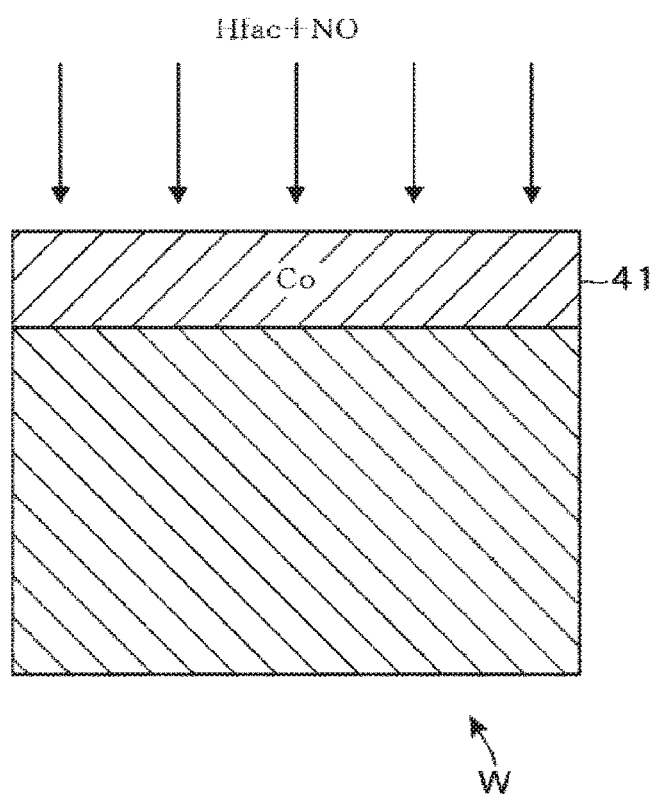
FIG. 5 is a longitudinal cross-sectional view of the wafer.

In this way, the Co film 41 is exposed to the NO gas and the Hfac gas supplied into the processing container 11, and the reactions described with reference to Equations 1 and 2 etch the front surface of the Co film 41 (FIG. 5). When the front surface of the Co film 41 is etched by a desired amount, the valves V2 and V3 are closed to stop the supply of the Hfac gas and the NO gas into the processing container 11, and the process performed by the etching apparatus 1 is terminated (time $t_4$).

According to the process performed by the etching apparatus 1 described above, the natural oxide film 42 is reduced by the $H_2$ gas to become the Co film 41, and then the Co film 41 is etched using the NO gas and the Hfac gas, through this process, it is possible to obtain a high etching rate, which will be described in detail later with an Evaluation test. By increasing the etching rate in this way, it is possible to reduce consumption of the NO gas and the Hfac gas, which reducing the operational cost of the etching apparatus 1. Furthermore, the flatness of the front surface of the Co film 41 which has been subjected to the etching process is relatively high, which will be described in more detail later in an Evaluation test. Therefore, it is also possible to prevent degradation in the performance of semiconductor devices manufactured from the wafer W.

In the case of removing the Co film by wet etching, a Co film is formed on the wafer W in a vacuum atmosphere, and then the wafer W is transferred to an apparatus provided in an atmospheric environment so as to be subjected to an etching process. However, according to the above-described process performed using the etching apparatus 1, it is not necessary to transfer the wafer W. Thus, it is possible to shorten the process time and to save the cost required for such a process compared with the case of performing the wet etching.

In the above process, the temperature of the wafer W is maintained to be constant at 200 to 250 degrees C. at a time period from time $t_2$ to time $t_4$, but the present disclosure is not limited to such a temperature control. In some embodiments, at a time period from time $t_2$ to time $t_3$, the temperature may be any temperature as long as the reduction action by the $H_2$ gas can be sufficiently obtained. Further, at a time period from time $t_3$ to time $t_4$, the temperature may be any temperature as long as the decomposition of the Hfac gas can be suppressed and thus etching can be performed. From such a viewpoint, it is preferable to heat the wafer W to, for example, 200 degrees C. to 250 degrees C. at the time period from times $t_2$ and $t_4$. In some embodiments, the flow rate of the $H_2$ gas supplied into the processing container 11 at a time period from time $t_1$ to time $t_3$ may be set to, for example, 50 sccm to 500 sccm, as long as the above reduction process can be performed. In addition, the internal pressure of the processing container 11 at the time period from time $t_2$ to time $t_4$ is not limited to the above-mentioned pressure, but may be set to $1.33 \times 10^3$ Pa (10 Torr) to $1.33 \times 10^4$ Pa (100 Torr).

In some embodiments, the Co film 41 subjected to the reduction process may be etched without being formed as the natural oxide film 42 again by exposure to the atmospheric environment. As an example, the reduction process may be performed with an $H_2$ gas in one processing container, and subsequently, the wafer W may be transferred to another processing container via a transfer path in which a vacuum atmosphere is maintained. An etching process may be performed in another processing container by an Hfac gas and a NO gas. However, from the viewpoint of preventing throughput from being reduced due to a time required for the transfer of the wafer W between the processing containers and a time required for the adjustment of the temperature of the wafer W after being transferred to another processing container, it is preferable to perform the reduction process and the etching process in a single processing container, as the process in the etching apparatus 1.

In addition, while in the etching apparatus 1, the Hfac gas and the NO gas has been described to be supplied into the processing container 11 in the state where they are mixed with each other, the present disclosure is not limited thereto. In some embodiments, the Hfac gas and the NO gas may be supplied to a processing space defined inside the processing container 11 through flow paths respectively corresponding to the Hfac gas and the NO gas and may be supplied to the wafer W while being mixed with each other inside the processing space. Further, in the etching apparatus 1, the $H_2$ gas and the mixed gas (of the Hfac gas and the NO gas) has been described to be supplied into the processing container 11 through different flow paths, but the present disclosure is not limited thereto. In some embodiments, the mixed gas and the $H_2$ gas may be supplied to a common flow path for these gases and may be supplied onto the front surface of the wafer W from the common flow path.

Next, during the processing by the etching apparatus 1 described above, a reaction between the NO gas and the front surface of the Co film 41 which has been subjected to the reduction process with the $H_2$ gas will be described in detail. As described above with reference to Equation 1, the front surface of the Co film 41 after the reduction process becomes CoO due to the oxidation action caused by the supplied NO. In the 3D orbital as the inner orbital of a Co atom which has a bivalent oxidation number and forms the CoO, unpaired electrons exist. In addition, since NO also has unpaired electrons, reactivity between CoO and NO is relatively high. As CoO and NO react with each other, Co electrons form a hybrid orbital, which makes it easy to form Co (hfac)$_2$. In addition, as described above, the Co film 41 is exposed to an oxidation atmosphere for a long period of time such that a relatively large amount of $Co_3O_4$ is produced. It is considered that the $Co_3O_4$ has no unpaired electrons, thus having low reactivity with NO.

Therefore, the oxidizing gas supplied to the wafer W after the $H_2$ gas-based reduction is not limited to the NO gas. It is preferable to use a gas having unpaired electrons from the viewpoint of increasing reactivity with the produced CoO. Specifically, for example, CO (carbon monoxide) may be used as the oxidizing gas. In some embodiments. $O_2$ (oxygen) gas, $O_3$ (ozone) gas. $N_2O$ (nitrous oxide) gas or the like, which has no unpaired electrons, may be used as the oxidizing gas.

(Second Process)

Figure 6:
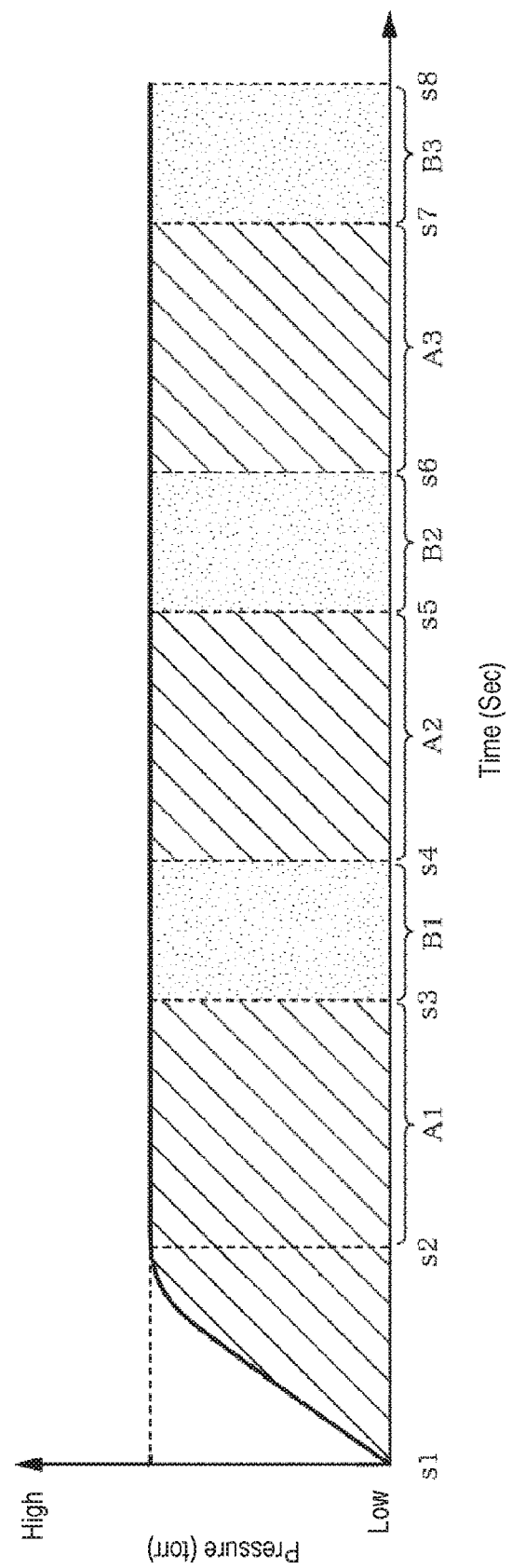
FIG. 6 is a graph showing another example of a transition of an internal pressure of the processing container.

Next, a second process performed by the etching apparatus 1 will be described with reference to a graph of FIG. 6, focusing on the differences from the first process described with reference to the graph of FIG. 3. For the graph of FIG. 6, the horizontal axis represents time and the vertical axis represents the internal pressure of the processing container 11, similarly to the graph of FIG. 3. In the graph, a time period for which the $H_2$ gas is supplied is marked with hatching and a time period for which the Hfac gas and the NO gas are marked with dots.

First, the supply of the $H_2$ gas is initiated at time s1. Meanwhile, when the temperature of the wafer W reaches a set temperature by heating, the wafer W is kept at the set temperature. Then, at time s2, the internal pressure of the processing container 11 reaches a set pressure. The interior of the processing container 11 is maintained at the set pressure. In this state, the reduction process is performed. The set temperature of the wafer W in the second process is, for example, 200 to 250 degrees C., which is the same as the set temperature of the wafer W in the first process. The set pressure in the processing container 11 in the second process is, for example, $1.33 \times 10$ Pa to $1.33 \times 10^4$ Pa, which is the same as the set pressure of the processing container 11 in the first process.

Subsequently, at time s3, the supply of the $H_2$ gas into the processing container 11 is stopped, and the Hfac gas and the NO gas are supplied into the processing container 11 to initiate the etching process. Thereafter, at time s4, the supply of the Hfac gas and the NO gas into the processing container 11 is stopped, and the supply of the $H_2$ gas into the processing container 11 is resumed. The etching process is stopped and the reduction process is resumed.

Thereafter, at time s5, the supply of the $H_2$ gas into the processing container 11 is stopped, and the supply of the Hfac gas and the NO gas into the processing container 11 is resumed. The reduction process is stopped, and the etching process is resumed. Subsequently, at time s6, the supply of the Hfac gas and the NO gas into the processing container 11 is stopped, and the supply of the $H_2$ gas into the processing container 11 is resumed. The etching process is stopped, and the reduction process is resumed. Thereafter, at time s7, the supply of the $H_2$ gas into the processing container 11 is stopped, and the supply of the Hfac gas and the NO gas into the processing container 11 is resumed. The reduction process is stopped, and the etching process is resumed. Subsequently, at time s8, the supply of the Hfac gas and the NO gas into the processing container 11 is stopped to terminate the etching process.

As described above, in the second process, a cycle including the reduction process based on the $H_2$ gas and the etching process based on the NO gas and the Hfac gas is repeated three times. In the graph, a time period from time s2 to time s3, a time period from time s4 to time s5, and a time period from time s6 to the time s7 during which the reduction process is performed are indicated by A1, A2, and A3, respectively. In this example, lengths of the time periods A1, A2, and A3 are set equal to each other. In addition, in the graph, a time period from time s3 to s4, a time period from time s5 to time s6, and a time period from time s7 to time s8 during which the etching process is performed are indicated by B1, B2, and B3, respectively. In this example, lengths of the time periods B1, B2, and B3 are set equal to each other.

The etching time in the second process is the sum of the lengths of the aforementioned time periods B1 to B3. Meanwhile, the etching time in the first process is the time period from time $t_3$ to time $t_4$. In a case where the etching time in the first process is equal to the etching time in the second process, the etching amount available in the second process is larger than that available in the first process, which will be described later with an Evaluation test. Therefore, according to the second process, it is possible to reduce the amount of the Hfac and the NO gas used in etching the Co film 41 by a desired level.

In the case where the etching amount is increased as described above, $Co_3O_4$ is generated in addition to CoO as the oxidation time is long as described above. That is to say, there is a possibility that $Co_3O_4$ is generated during the oxidation process based on the NO gas. However, by repeating the cycle including the reduction process and the etching process as described above, $Co_3O_4$ thus generated is reduced and Co is increased. It is considered that, since CoO is newly generated from Co and reacts with NO, the etching amount is increased as described above. The number of cycles to be executed in the second process is not limited to three, but may be two, or four or more.

In the first process and the second process, the reducing gas for performing the reduction process of the natural oxide film 42 is not limited to the $H_2$ gas, but may be an $NH_3$ (ammonia) gas, or an $H_2S$ (hydrogen sulfide) gas. These $H_2$, $NH_3$, and $H_2S$ gases are reducing gases having a non-etching property, which reduce Co without etching the natural oxide film 42, and contain hydrogen atoms. Any β-diketone may be used as the etching gas as long as it is capable of forming a complex having a vapor pressure lower than that of CoO. For example, gases such as trifluoroacetylacetone (also referred to as "1,1,1-trifluoro-2,4-pentanedione"), acetylacetone and the like may be used instead of the Hfac gas.

In addition, a metal film, which is formed on the front surface of the wafer W and is etched by the supply of the β-diketone gas and the oxidizing gas after the reduction process based on the reducing gas is not limited to the film composed of Co. Specifically, the metal film may be a film composed of, for example, Ni (nickel), Cu (copper), Mn (manganese), Zr (zirconium), or Hf (hafnium). In addition, the wording "metal constituting the metal film" used herein means not to be included in the metal film as additives or impurities, but to be included in the metal film as a main component.

It should be understood that the embodiments disclosed herein are examples in all respects and are not restrictive. The above embodiments may be omitted, replaced, or modified in various forms without departing from the scope and spirit of the appended claims.

(Evaluation Tests)

Hereinafter, descriptions will be made on Evaluation tests, which were performed in relation with the present disclosure.

<Evaluation Test 1>

Evaluation test 1-1 which is the first process described with reference to FIG. 3 was performed, and the etching rate (etching amount/etching time) of the Co film 41 was measured after the first process. The time period from time $t_2$ to time $t_3$ during which the reduction process is performed was set to 300 seconds, and the time period from time $t_3$ and time $t_4$ during which the etching process is performed was set to 200 seconds.

In addition, Evaluation test 1-2 which is the second process described with reference to FIG. 6 was performed, and the etching rate of the Co film 41 was measured after the second process. In Evaluation test 1-2, each of the time periods B1, B2, and B3 during which the etching process is performed was set to 67 seconds. That is to say, the etching time was set to be 200 seconds which is the same as that in Evaluation test 1-1. In addition, each of the time periods A1, A2, and A3 during which the reduction process is performed was set to 300 seconds.

In addition, Comparative test 1 which is the $H_2$ gas was not supplied into the processing container 11, and the Hfac gas and the NO gas were supplied into the processing container 11. The etching process was performed while changing the internal pressure of the processing container 11 as illustrated in FIG. 3. More specifically, the Hfac gas and the NO gas were supplied into the processing container 11 such that the internal pressure of the processing container 11 is increased to the set pressure. After reaching the set pressure, the etching process was performed while supplying the Hfac gas and the NO gas such that the internal pressure is maintained constant at the set pressure. The etching time from when the set pressure is reached till when the supply of the Hfac gas and the NO gas is stopped was set to 600 seconds.

In Evaluation test 1-1, Evaluation test 1-2, and Comparative test 1, the set temperature of the wafer W, the set pressure in the processing container 11, and the flow rate of the Hfac gas supplied into the processing container 11 were set to 200 to 250 degrees C., $1.33 \times 10^3$ Pa to $1.33 \times 10^4$ Pa, and 50 to 500 sccm, respectively.

The etching rate in Evaluation test 1-1 was 27.5 nm/200 seconds=8.25 nm/minute, the etching rate in Evaluation test 1-2 was 41.1 nm/200 seconds=12.33 nm/minute, and the etching rate in Comparative test 1-1 was 48.3 nm/600 seconds=4.83 nm/minute. Therefore, the etching rates in Evaluation tests 1-1 and 1-2 were larger than the etching rate in Comparative test 1-1. Thus, from the results of Evaluation test 1, the effects of the process of the present disclosure were confirmed. In addition, the etching rate was higher in Evaluation test 1-2 than that in Evaluation test 1-1. Therefore, it was confirmed that by repeating the cycle which includes the step of supplying the $H_2$ gas and the step of supplying the NO gas and the Hfac gas in a relatively short period of time, the effect of reducing (modifying) the front surface of the Co film by the $H_2$ gas was further promoted.

<Evaluation Test 2>

Evaluation test 2-1 which is the Co film 41 was formed on the front surface of the wafer W so as to have a thickness of 50 nm. Thereafter, the wafer W was exposed to an atmospheric environment. Subsequently, the Co film 41 was analyzed using X-ray photoelectron spectroscopy (XPS).

In addition, Evaluation test 2-2, as in Evaluation test 2-1, after the formation of the Co film 41, the wafer W exposed to the atmospheric environment was subjected to the reduction process with the $H_2$ gas described in the embodiments of the present disclosure. Thereafter, the Co film 41 was analyzed by XPS.

Figure 7:
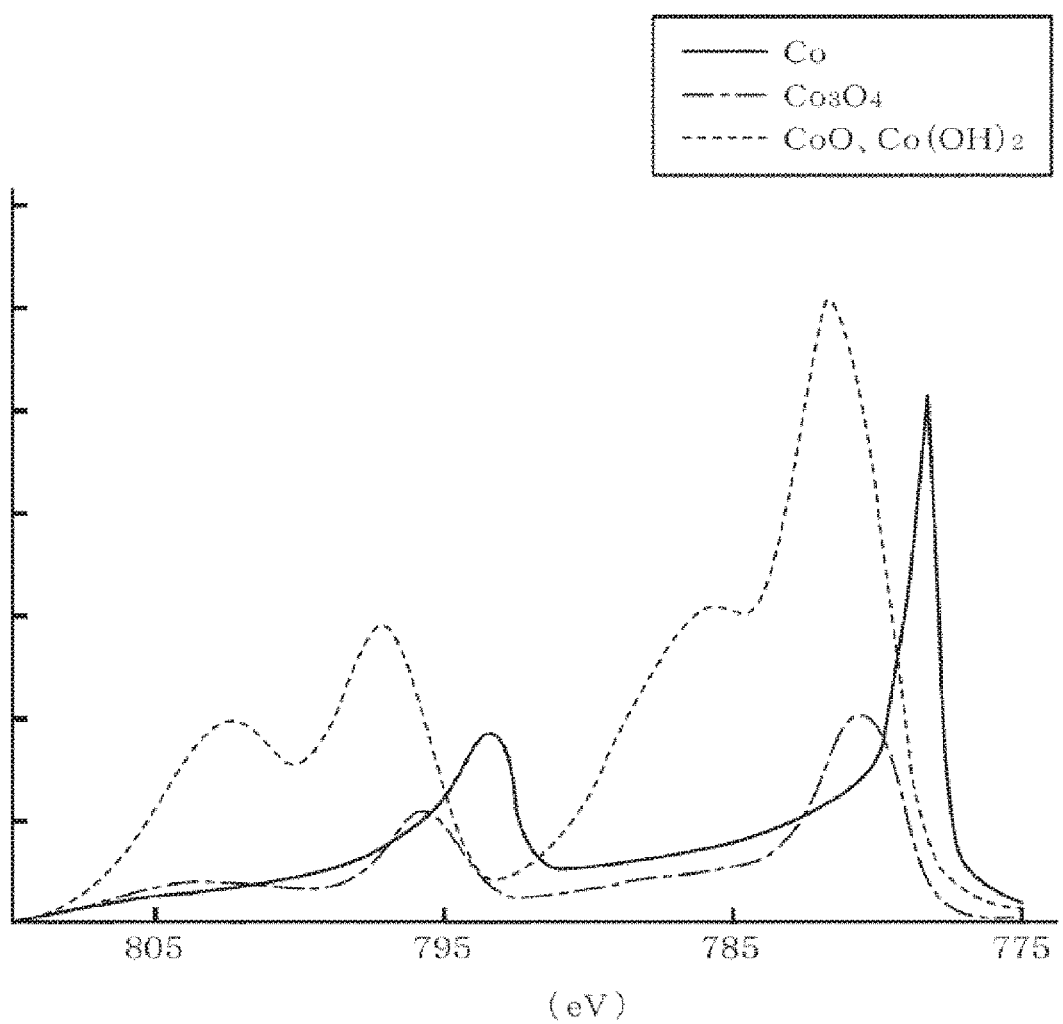
FIG. 7 is a graph showing the results of an Evaluation test using XPS.
Figure 8:
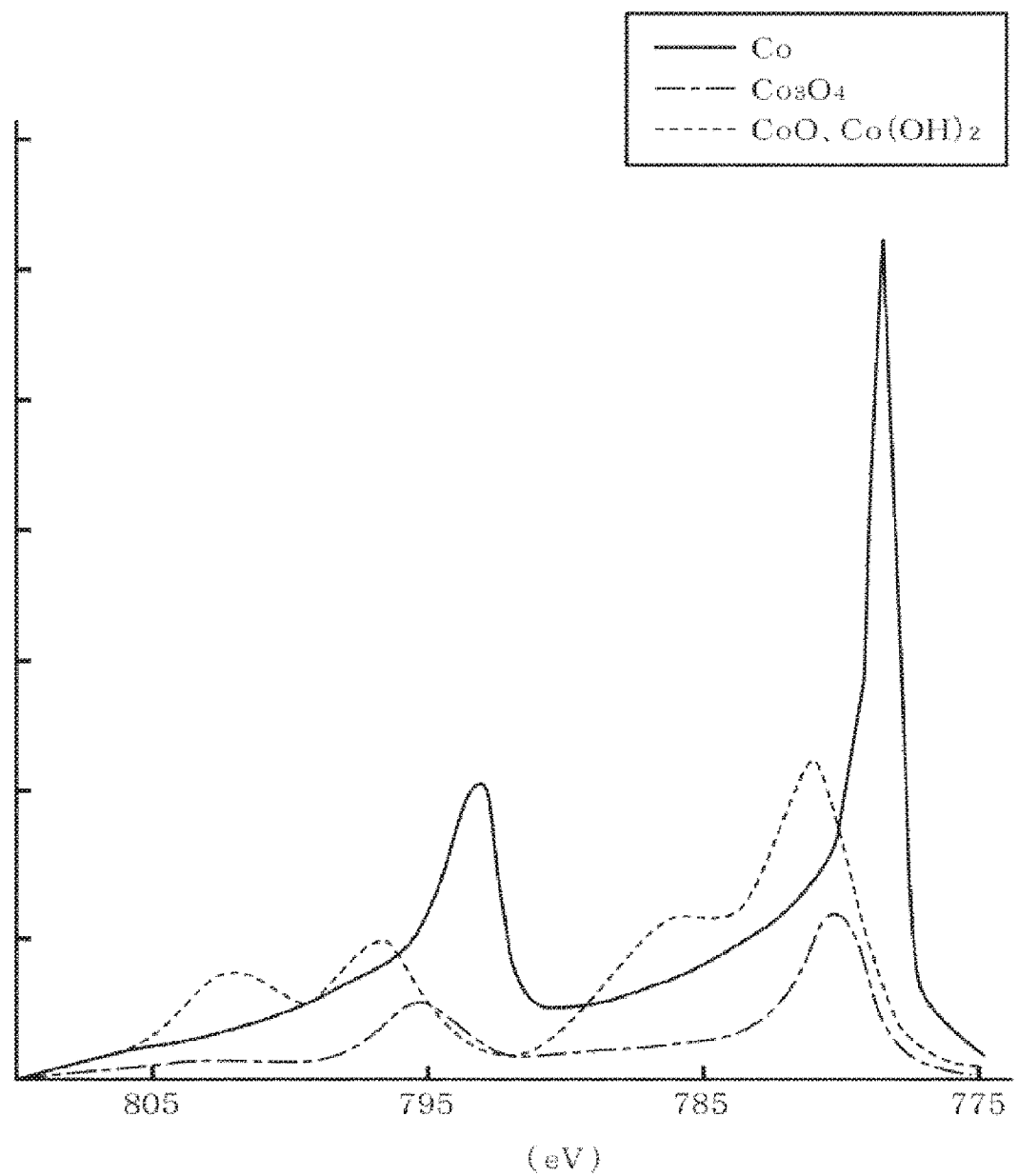
FIG. 8 is a graph showing the results of an Evaluation test using XPS.

FIG. 7 is a spectrum showing the results of Evaluation test 2-1, and FIG. 8 is a spectrum showing the results of Evaluation test 2-2. In the spectrum of each of these figures, the horizontal axis represents a binding energy (unit: eV) and the vertical axis represents an intensity. From each spectrum, it was confirmed that Co, $Co_3O_4$, CoO, and $Co(OH)_2$ present on the front surface of the Co film 41. In each spectrum, a waveform representing Co is indicated by a solid line, a waveform representing $Co_3O_4$ is indicated by a dashed line, and a waveform representing CoO and $Co(OH)_2$ is indicated by a dotted line.

As a result of comparing the spectrum of Evaluation test 2-1 with the spectrum of Evaluation test 2-2, no significant difference was observed in the waveforms representing $Co_3O_4$. However, comparing the waveforms representing CoO and $Co(OH)_2$, in Evaluation test 2-1, a relatively large peak was observed in the vicinity of 780 eV, but in Evaluation test 2-2, the peak in the vicinity of 780 eV was small. Comparing the waveforms representing Co, the peak in Evaluation test 2-2 was larger in the vicinity of 777 eV than that in Evaluation test 2-1.

In addition, in Evaluation test 2, in addition to each of the above-mentioned spectrums, a ratio of each of Co, $Co_3O_4$, and CoO was also obtained when the total amount of Co, $Co_3O_4$, and CoO was taken as 100%. With respect to these ratios, in Evaluation test 2-1, Co was 25%, $Co_3O_4$ was 15%, and CoO was 60%, and in Evaluation test 2-2. Co was 49%. $Co_3O_4$ was 14%, and CoO was 37%.

Therefore, it was confirmed from Evaluation Test 2 that the ratio of Co to CoO and $Co(OH)_2$ on the front surface of the Co film 41 is increased by the reduction process. Thus, as described in the embodiments of the present disclosure, it is considered that by supplying NO after the reduction process, it is possible to generate a large amount of CoO newly and to promote etching with the Hfac gas.

<Evaluation Test 3>

Similarly to the wafer W in Evaluation test 2-1, in the wafer W exposed to an atmospheric environment after the formation of the Co film 41, an image of the front surface of the Co film 41 was acquired using an electron microscope (SEM). For the sake of convenience in description, the image acquired in this manner is referred to as an image of an unprocessed Co film.

Further, with respect to the wafer W subjected to the above-described first process, an image of the front surface of the Co film 41 after etching was acquired using SEM. For the sake of convenience in description, the obtained image is referred to as an image of a $H_2$-processed Co film.

Further, a process similar to the first process was performed on the wafer W, except that the natural oxide film 42 is etched by supplying the Hfac gas instead of the $H_2$ gas. That is to say, an etching process similar to the etching process as described in the Background section of the present disclosure, which includes supplying the Hfac gas alone to the wafer W and subsequently supplying the mixed gas of the Hfac gas and the NO gas to the wafer W, was performed. Then, an image of the front surface of the Co film 41 after etching was obtained using SEM. For the sake of convenience in description, the image acquired in this manner is taken as an image of an Hfac-processed Co film.

Figure 9:
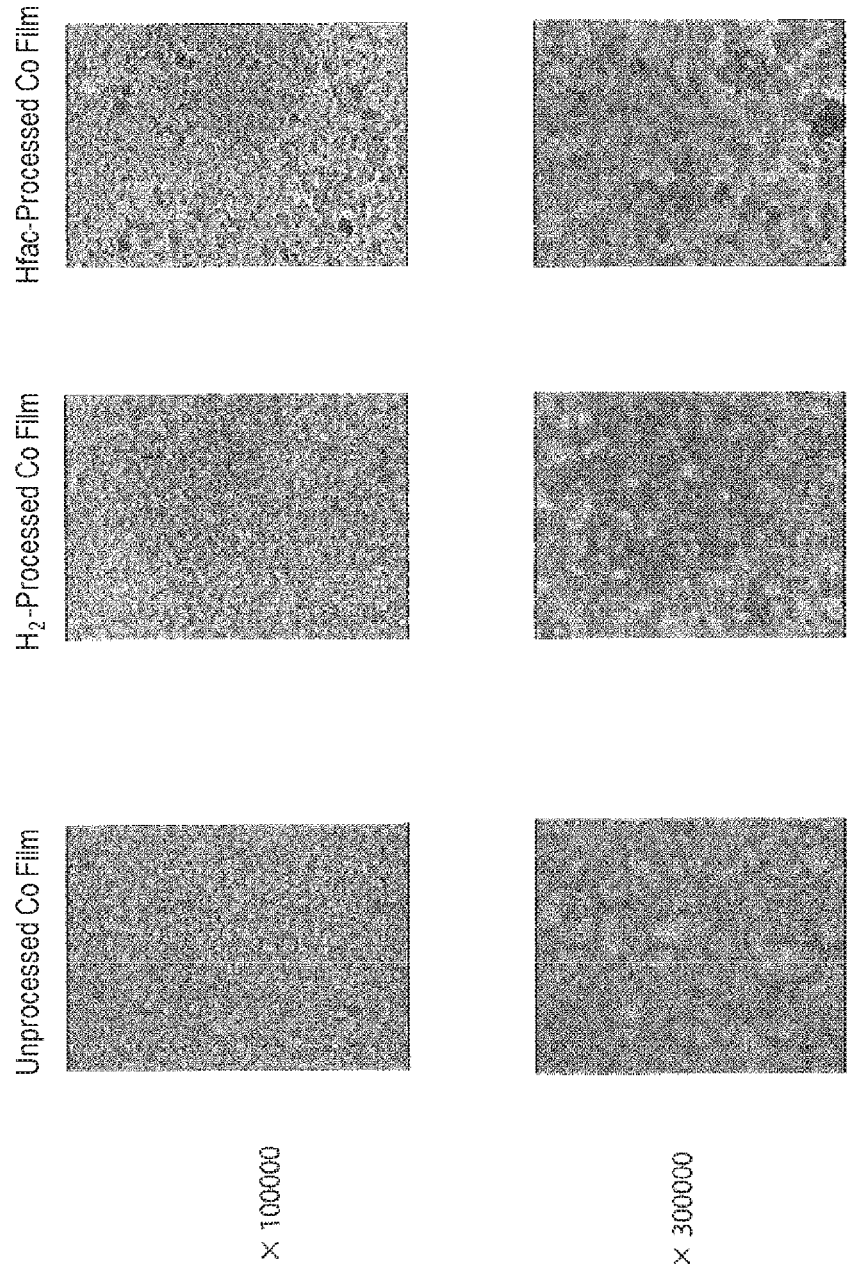
FIG. 9 is an explanatory view showing states of surfaces of wafers after etching.

FIG. 9 shows each of the images acquired as described above. In FIG. 9, the images of upper and lower stages are available when setting magnifications of SEM to 100,000 times and 300,000 times, respectively. From FIG. 9, comparing the image of the unprocessed Co film and the image of the $H_2$-processed Co film, a grain size of the $H_2$-processed Co film was smaller than that of the unprocessed Co film at a level of 10 nm. The reason why the grain sizes of the unprocessed Co film and the $H_2$-processed Co film are different from each other is because the unprocessed Co film and the $H_2$-processed Co film are different from each other in terms of the composition of compounds constituting the front surface of the Co film 41. Accordingly, it was confirmed from each of the unprocessed Co film and the $H_2$-processed Co film, that modification of the Co film 41 is performed by the supply of the $H_2$ gas.

In addition, comparing the $H_2$-processed Co film with the Hfac-processed Co film pinholes were observed in the Hfac-processed Co film, but no pinholes were observed in the $H_2$-processed Co film. A front surface of the $H_2$-processed Co film was confirmed to be higher in flatness than that of the Hfac-processed Co film. Therefore, according to the method of the present disclosure, it was confirmed that it is possible to suppress deterioration in flatness of the front surface of the Co film 41 after the etching process.

<Evaluation Test 4>

Evaluation test 4-1 which is the first process described in FIG. 3 was performed to etch the Co film 41 on the front surface of the wafer W. Subsequently, an image of the Co film 41 remaining on the front surface of the wafer W was picked up. Further, etching amounts at multiple portions of the Co film 41 were measured. The average value and the standard deviation ($\sigma$) of the etching amounts were calculated. In Evaluation test 4-1, the set temperature of the wafer W in the first process was set to be higher than 200 degrees C. and lower than or equal to 250 degrees C. The etching time was set to 200 seconds, and the supply amount of the NO gas during etching was set to 0.5 to 35 sccm.

Further, Evaluation test 4-2 which is a test substantially similar to Evaluation test 4-1 was performed. In Evaluation test 4-2, the set temperature of the wafer W in the first process was set to 150 degrees C. to 200 degrees C., the etching time was set to 700 seconds, and the supply amount of the NO gas was set to 0.5 to 35 sccm. Except for the set temperature and the etching time of the wafer W, the processing conditions of the wafer W in Evaluation test 4-2 was the same as those of the wafer W in Evaluation test 4-1.

Figure 10:
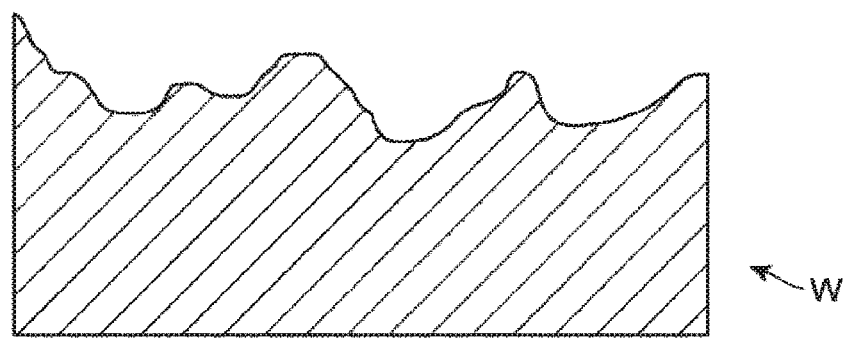
FIG. 10 is a longitudinal cross-sectional view of the surface of the wafer after etching.
Figure 11:
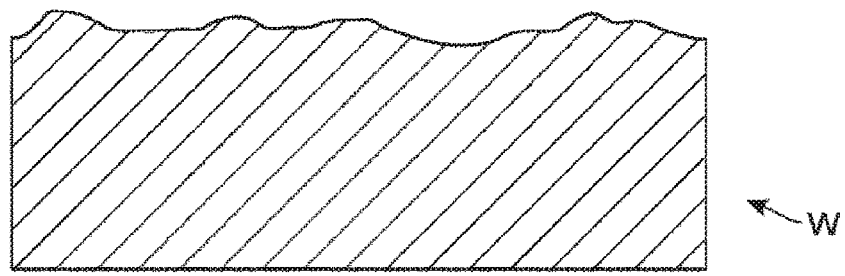
FIG. 11 is a longitudinal cross-sectional view of the surface of the wafer after etching.

FIGS. 10 and 11 are longitudinal cross-sectional views of the front surfaces of wafers W, which are respectively shown based on the imaging result of Evaluation test 4-1 and the imaging result of Evaluation test 4-2. In Evaluation test 4-1, the average value of the etching amounts was 25.0 nm and the standard deviation ($\sigma$) was 2.0 nm. In Evaluation test 4-2, the average value of the etching amounts was 21.1 nm and the standard deviation ($\sigma$) was 1.2 nm. As described above, Evaluation test 4-2 and Evaluation test 4-1 were substantially the same in the average value, and Evaluation Test 4-2 was smaller in the standard deviation ($\sigma$) than Evaluation test 4-1. As is apparent from the values of $\sigma$ and FIGS. 11 and 12, a surface roughness of the Co film 41 after etching was smaller in Evaluation test 4-2 than in Evaluation test 4-1.

Accordingly, it was confirmed from Evaluation test 4 that even if the wafer W is maintained at a relatively low temperature of 150 to 200 degrees C., it is possible to perform the above-described reduction of Co and to etch Co after the reduction. Further, it was confirmed that it is possible to reduce the surface roughness of the Co film 41 after the etching by processing the wafer W at such a relatively low temperature as described above. In addition, it was confirmed that even when the processing is performed in the state in which the temperature of the wafer W is set to be a relatively low level as described above, it is possible to obtain a sufficient etching amount by appropriately setting etching conditions other than the temperature of the wafer W.

Possible reasons for the fact that the surface roughness of the Co film 41 after etching is lower in Evaluation test 4-2 than in Evaluation test 4-1 will be described below. As in Evaluation test 4-1, in the case where the $H_2$ gas is supplied in the state where the temperature of the wafer W is set to a relatively high temperature which is higher than 200 degrees C. and lower than or equal to 250 degrees C., the reducibility of the $H_2$ gas to CoO and $Co_3O_4$ is relatively high. Thus, agglutination of Co itself occurs when reduction from CoO and $Co_3O_4$ to Co progresses. By such agglutination, Co accumulates to form a relatively large mass. Such mass remains during etching. As a result, it is considered that the surface roughness of the Co film 41 after etching becomes relatively large. In contrast, in the case where the $H_2$ gas is supplied to the wafer W in the state where the temperature of the wafer W is relatively low as in Evaluation test 4-2, the reducibility of the $H_2$ gas is suppressed from becoming too high, and thus the reduction progresses gently. Thus, the agglutination of Co is suppressed. As a result, it is considered that the surface roughness of the Co film 41 after etching becomes relatively small.

That is to say, although the temperature of the wafer W during the first process and the second process has been described to be set to fall within a range of 200 degrees C. to 250 degrees C., the temperature of the wafer W may be set to fall within a range of 150 degrees C. to 200 degrees C.

The present disclosure is advantageous in increasing an etching amount of a metal film per unit time.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method comprising:
   a first gas supply step of supplying a reducing gas to a workpiece having a metal film formed thereon to reduce a front surface of the metal film, the workpiece being accommodated in at least one processing chamber;
   subsequently, a second gas supply step of supplying an oxidizing gas for oxidizing the metal film and an etching gas composed of a β-diketone to etch the oxidized metal film; and
   repeating a cycle including the first gas supply step and the second gas supply step,
   wherein the reducing gas, the oxidizing gas, and the etching gas are supplied to the workpiece heated to 150 degrees C. to 200 degrees C.,
   wherein the first gas supply step is performed without a plasma treatment, and
   wherein, in the first gas supply step, the front surface of the metal film is reduced by the reducing gas such that a grain size of the front surface of the metal film is smaller than 10 nm.

2. The etching method of claim 1, wherein the first gas supply step includes supplying the reducing gas to the metal film whose surface is oxidized.

3. The etching method of claim 1, wherein the at least one processing chamber includes a first processing container used when performing the first gas supply step and a second processing container used when performing the second gas supply step, and
   wherein the first processing container and the second processing container are the same.

4. The etching method of claim 1, wherein the metal film is made of one selected from the group consisting of cobalt, nickel, copper, and manganese.

5. The etching method of claim 4, wherein the metal film is made of cobalt.

6. The etching method of claim 1, wherein the reducing gas has a non-etching property with respect to the metal film and is a gas containing hydrogen atoms.

7. The etching method of claim 6, wherein the reducing gas includes one selected from the group consisting of an $H_2$ gas, an $NH_3$ gas, and an $H_2S$ gas.

8. The etching method of claim 1, wherein the oxidizing gas includes a nitrogen monoxide gas or a carbon monoxide gas.

9. The etching method of claim 8, wherein the oxidizing gas includes the nitrogen monoxide gas, and
    the second gas supply step includes supplying the nitrogen monoxide gas and the etching gas into a processing container in which the workpiece is accommodated such that a ratio of a flow rate of the nitrogen monoxide gas to a flow rate of the etching gas is 0.001 to 0.7.

\* \* \* \* \*